United States Patent [19]

Wong

[11] Patent Number: 4,760,014

[45] Date of Patent: Jul. 26, 1988

[54] METHOD FOR TREATING MIXTURES CONTAINING PHOTOPOLYMERIC RESIN AND COMPOSITIONS THEREFOR

[75] Inventor: Kwee C. Wong, Orange County, Calif.

[73] Assignee: Great Lakes Chemical Corporation, West Lafayette, Ind.

[21] Appl. No.: 891,883

[22] Filed: Aug. 1, 1986

[51] Int. Cl.[4] ................................................. G03C 5/24
[52] U.S. Cl. .................................... 430/399; 430/319; 430/325; 430/326; 430/329; 210/723; 210/726
[58] Field of Search ............... 430/325, 326, 329, 331, 430/319, 399, 398; 210/723, 724, 726, 712

[56] References Cited

U.S. PATENT DOCUMENTS 4,559,295 12/1985 Tomisawa et al. ................. 430/325

OTHER PUBLICATIONS

Thompson et al, Introduction to Microlithography, American Chemical Society, Washington, D.C. 1983, pp. 111–116.

Primary Examiner—Nancy A. B. Swisher
Assistant Examiner—José G. Dees
Attorney, Agent, or Firm—Senniger, Powers, Leavitt and Roedel

[57] ABSTRACT

A process for treating an aqueous alkaline spent mixture produced during preparation of circuit boards and comprising a photopolymer resin. According to the method, first, an acid, a polyvalent cation and a coagulation aid are mixed with the spent mixture to produce a heterogeneous treated mixture comprising coagulated, precipitated photopolymer resin and an aqueous phase. Then, the coagulated, precipitated photopolymer resin is separated from the aqueous phase to produce a non-tacky, non-gumlike photopolymer resin sludge.

9 Claims, 2 Drawing Sheets

METHOD FOR TREATING MIXTURES CONTAINING PHOTOPOLYMERIC RESIN AND COMPOSITIONS THEREFOR

BACKGROUND OF THE INVENTION

This invention relates generally to the treatment of photopolymeric resin containing mixtures obtained during photo-imaging processes, and more particularly to the treatment of spent mixtures produced in the removal of photoresist materials during the preparation of printed circuit boards. Still more particularly, this invention relates to treatment of such spent mixtures to reduce the gumminess and unctuousness of the mixture, thereby facilitating disposal of the spent mixtures.

Generally, preparation of a printed circuit board involves several steps. First the surface of a copper-clad substrate element of high dielectric strength is coated with a photopolymer film called photoresist. Next, a portion of the photoresist is exposed to electromagnetic radiation through a masking stencil. The radiation polymerizes the exposed areas of the photoresist, rendering the exposed areas less soluble. The photoresist coating of the copperclad substrate is then processed with a developing agent, conventionally a mild alkaline aqueous developer solution. While the developer solution is aqueous, it may contain a non-aqueous solvent, such as ethylene glycol ether, in addition to water. Upon contact of the coating by the developer solution, a reaction as illustrated in the following equation is understood to take place:

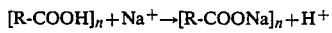

$$[R\text{-}COOH]_n + Na^+ \rightarrow [R\text{-}COONa]_n + H^+$$

where R is a high molecular weight hydrophobic group.

The developer solution thereby removes the unexposed photoresist from the copper surface. By contrast, in the areas where exposure to light has polymerized or otherwise cured the film, changing the film's physical properties and lowering its solubility, the resist adheres to the copper surface and is not removed by the developer. The copper layer is then etched either with hydrogen peroxidesulfuric acid etchant or ammonical etchant to remove the copper in those areas unprotected by the mask of polymerized film remaining on the copper surface. After the polymerized photopolymer resin, or resist, has served its masking purpose, it is removed, or "stripped", by treatment with a stripping agent, normally a hot, alkaline aqueous or partially aqueous solution. Thus, a substrate with a partial coating of copper is formed. The copper remaining on the substrate forms a circuit pattern corresponding to the desired circuit configuration.

Another method for preparing printed circuit boards employs pasty, alkaline soluble photopolymers which, according to industry convention, are called "screening ink" or "liquid resist". In this method, a photoreactive emulsion is screened onto a copper coated substrate to form an image of the desired pattern. The pattern is then screened onto the substrate by forming the image on a taut screen made of stainless steel or synthetic fabric. The screen has a mesh size range from 200 to 230. The screen is aligned over the substrate and acts as a stencil. Ink is then applied by manually or mechanically pushing the ink across the screen with a squeegee. A thin layer (about 100 to about 300 microinches) of the resist film is spread thereby across the entire pattern. As a result, the image of the circuit pattern is transformed onto the copper coating on the substrate.

The screened image on the copper coating on the substrate is then cured by ultraviolet radiation or by baking. The curing process typically includes air-drying, pre-baking and post-baking in addition to the ultraviolet radiation or baking step. The pre-baking steps drive off some solvents, thereby avoiding run off of ink. The postbaking steps drive off residual solvents from the resist. The cured ink resists the chemical attack during the subsequent cleaning, plating and etching steps.

After the etching step, the ink is removed with an alkaline stripper solution. When the stripper solution is saturated with resist, the solution must be treated and fresh solution is added.

In either method of preparing circuit boards, when the developer solution and stripper solution have served their purpose of removing photopolymer resin, they are termed "spent." Typically in this process, the spent "solutions" have become saturated with resist, and often further contain undissolved resist (the photoresist and liquid resist are generically designated herein as "resist" or "resin"). Thus, commonly the spent "solutions" are not true solutions, but are actually heterogeneous mixtures comprising suspensions of particulate resins, often in colloidal form. The two types of spent mixtures, developer and stripper, differ from one another in that they contain photopolymers of different degrees of polymerization. Nevertheless, both types of spent mixtures require environmental treatment, typically by first separating undissolved photopolymer resins out of the spent mixture by filtration. The filtrate is then acidified to a pH of about 3 to 4 by addition of a mineral acid. Acidification precipitates formerly dissolved resins in the filtrate. The precipitated resins are then removed from the filtrate by a second filtration and the resulting substantially resin-free solution neutralized with alkali to an appropriate pH and treated as waste water. However, in the second filtration, the removed precipitated resins present serious problems since they are unctuous and gumlike, tenaciously adhering to any surface contacted. Thus, handling and disposal of the removed resins as well as cleaning of the equipment and other surfaces contacted by the resins is difficult.

An alternative treatment process may involve the addition of calcium chloride to the spent mixtures, as opposed to (not in combination with) mineral acid. The calcium chloride process utilizes what is called a "salt out" effect, in contrast to a chemical reaction. Such calcium chloride process also suffers drawbacks. For example, the removal of resist in such a process is not complete.

SUMMARY OF THE INVENTION

Among the several objects of the present invention, therefore, may be noted the provision of a method for facilitating the handling and disposal of spent developing and stripping mixtures produced during the preparation of circuit boards; the provision of a method for facilitating the cleaning of equipment and other surfaces contacted by such spent mixture; the provision of a method for treating such spent mixtures so as to produce a non-unctuous, non-gumlike sludge; the provision of a composition with which such spent mixture may be treated to prevent formation of an unctuous, gumlike sludge; the provision of a treated spent mixture that is not unctuous or gumlike; the provision of a method for treating spent mixtures which eliminates the necessity of more than one separation step during the treatment of the spent mixture; and the provision of a method for treating spent mixtures wherein relatively small proportions of acid are required for acidification of the spent mixture.

Briefly, therefore, the present invention is directed to a novel process for treating an aqueous alkaline spent mixture produced during preparation of circuit boards and comprising a photopolymer resin. The method comprises several steps. First, an acid, a polyvalent cation and a coagulation aid are mixed with the spent mixture to produce a heterogeneous treated mixture comprising coagulated, precipitated photopolymer resin and an aqueous phase. Then, the coagulated, precipitated photopolymer resin is separated from the aqueous phase to produce a non-tacky, non-gumlike photopolymer resin sludge.

The present invention is further directed to a novel process for preparation of a printed circuit board. In the process, a layer comprising a photoresist is applied over the surface of a copper sheet. The opposite surface of the copper sheet is adhered to a substrate element constituted of a material having a high dielectric strength. Next, the photoresist layer is exposed to electromagnetic energy through a photographic transparency or stencil having a pattern therein corresponding to the desired configuration of a circuit to be produced on said substrate element. The susceptibility to removal by a developing agent of the photoresist of said layer in the areas thereof struck by electromagnetic energy is thereby altered and a pattern of photoresist material which is complementary to the circuit pattern is produced in the layer. The complementary pattern of photoresist material may be removed by the developing agent to expose portions of said copper sheet which are not part of said circuit. Then, the developing agent is applied to the resist layer to remove the resist from said sheet in the complementary pattern. A spent developer mixture is thereby produced which comprises resist. An acid, a polyvalent cation and a coagulation aid are mixed with the spent mixture to produce a heterogeneous treated mixture comprising coagulated, precipitated photopolymer resin and an aqueous phase. Then, the coagulated, precipitated photopolymer resin is separated from the solution to produce a non-tacky, non-gumlike photoresist sludge.

The invention is further drawn to a novel process for preparation of a printed circuit board. In the process, a layer comprising a photoresist is applied over the surface of a copper sheet. The opposite surface of the copper sheet is adhered to a substrate element constituted of a material having a high dielectric strength. Next, the photoresist layer is exposed to electromagnetic energy through a photographic transparency or stencil having a pattern therein corresponding to the desired configuration of a circuit to be produced on said substrate element. The susceptibility to removal by a developing agent of the photoresist of said layer in the areas thereof struck by electromagnetic energy is thereby altered and a pattern of photoresist material which is complementary to the circuit pattern is produced in the layer. The complementary pattern of photoresist material may be removed by the developing agent to expose portions of said copper sheet which are not part of said circuit. Then, the developing agent is applied to the resist layer to remove the resist from said sheet in the complementary pattern. A spent developer mixture is thereby produced which comprises resist. The copper exposed by the removal of the photoresist is then contacted with an etching solution, thereby dissolving and removing copper from the substrate in the complementary pattern. In addition, a stripping agent is applied to the photoresist remaining on the copper to remove the remaining photoresist from the copper, thereby producing a spent stripper mixture comprising photoresist. An acid, a polyvalent cation and a coagulation aid are mixed with the spent stripper mixture to produce a heterogeneous treated mixture comprising coagulated, precipitated photopolymer resin and an aqueous phase. Then, the coagulated, precipitated photopolymer resin is separated from the aqueous phase to produce a non-tacky, non-gumlike photopolymer resin sludge.

The invention is further drawn to a novel process for preparation of a printed circuit board. In the process, a layer comprising a photoresist is applied over the surface of a copper sheet. The opposite surface of the copper sheet is adhered to a substrate element constituted of a material having a high dielectric strength. Next, the photoresist layer is exposed to electromagnetic energy through a photographic transparency or stencil having a pattern therein corresponding to the desired configuration of a circuit to be produced on said substrate element. The susceptibility to removal by a developing agent of the photoresist of said layer in the areas thereof struck by electromagnetic energy is thereby altered and a pattern of photoresist material which is complementary to the circuit pattern is produced in the layer. The complementary pattern of photoresist material may be removed by the developing agent to expose portions of said copper sheet which are not part of said circuit. Then, the developing agent is applied to the photoresist layer to remove the photoresist from said sheet in the complementary pattern. A first spent mixture is thereby produced which comprises photoresist. The copper exposed by the removal of the photoresist is then optionally contacted with an electroplating solution, thereby forming the pattern with lead-tin solder over the exposed copper substrate. In addition, the remaining photoresist on the copper of said circuit is contacted with a stripping agent, thereby removing the remaining photoresist from the copper, thereby producing a second spent mixture comprising photoresist. Next, an acid, a polyvalent cation and a coagulation aid are mixed with at least one of the spent mixtures to produce a heterogeneous treated mixture comprising coagulated, precipitated photopolymer resin and an aqueous phase. Then, the coagulated, precipitated photopolymer resin is separated from the aqueous phase to produce a non-tacky, non-gumlike photopolymer resin sludge.

The invention is further directed to a composition adapted for treating an aqueous, alkaline spent mixture comprising photopolymer resin, the spent mixture having been produced during preparation of circuit boards. The composition comprises an acid and a polyvalent cation, wherein the polyvalent cation comprises a metal salt selected from a group consisting of aluminum chloride, aluminum sulfate, zinc chloride and zinc sulfate.

The invention is further directed to a process for preparation of a printed circuit board. In the process, a surface of a copper sheet is covered with a screen, the opposite surface of said copper sheet being adhered to a substrate element constituted of a material having a high dielectric strength. The screen is pervious to a liquid resist ink in a pattern corresponding to a desired circuit and impervious to said ink in a pattern complementary to the circuit. Liquid resist ink is applied across the screen such that the resist ink passes through the pervious portion of the screen corresponding to the circuit pattern thereby forming a liquid resist image of the desired pattern on the surface of the copper sheet. Then the liquid resist on the copper is cured to produce a cured liquid resist ink image of the desired circuit pattern on the copper. The image is resistant to chemical attack by an etching agent. A hot, alkaline stripping agent is applied to the resist ink on the copper to remove the resist from the copper, thereby producing a spent mixture comprising resist. An acid, a polyvalent cation and a coagulation aid are mixed with the spent mixture to produce a heterogeneous treated mixture comprising coagulated, precipitated photopolymer resin and an aqueous phase. Then, the coagulated, precipitated photopolymer resin is separated from the aqueous phase to produce a non-tacky, non-gumlike photopolymer resin sludge.

Other objects and features of this invention will be in part apparent and in part pointed out hereinafter.

BRIEF DESCRIPTION OF THE DRAWINGS

The drawings illustrate schematically various steps in the process of the preparation of a printed circuit board.

DESCRIPTION OF THE PREFERRED EMBODIMENTS

In accordance with this invention, a process has been discovered for removal of photopolymer resins and liquid resists from spent developer and stripper mixtures without the formation of an unctuous, gumlike sludge. In particular, it has been found that a process involving the addition of a novel combination of a polyvalent cation and an acid to the spent developer or stripper mixture results in the formation of a non-tacky, non-gumlike sludge. Advantageously, a coagulation aid is also added to the mixture, either simultaneously with or after addition of the polyvalent cation and acid. By this method, therefore, the present invention avoids the problems resulting from the ordinary treatment of spent mixtures produced during the preparations of circuit boards. In particular, the novel process prevents the tenacious adherence of unctuous, gumlike sludge to equipment and other surfaces contacted by the sludge, and thereby eliminates the difficulty otherwise encountered in cleaning surfaces contacted by the sludge and in removal and disposal of the sludge. In addition, it has been found that, in practicing the method of this invention, the spent mixture need not be acidified to the degree previously necessary to precipitate the resins. Thus, acid consumption is reduced.

Figure 1:
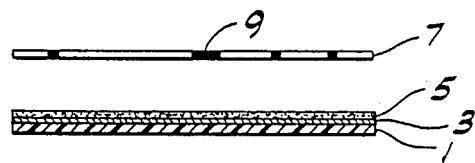
FIG. 1 is an elevational view of a copper sheet supported on a dielectric substrate and having a resist layer thereon which is being exposed through a photographic transparency or stencil.
Figure 2:
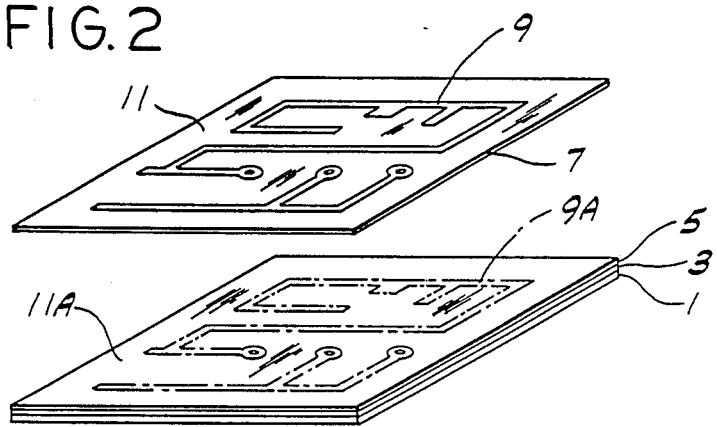
FIG. 2 is a perspective view showing the circuit pattern in the stencil, and the complementary pattern in a positive working photoresist layer which is rendered removable by a developer after exposure of the photoresist layer through the stencil.
Figure 3:
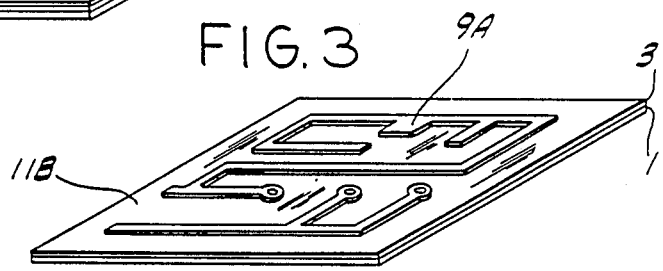
FIG. 3 shows the intermediate product obtained upon removal of the resist in the complementary pattern by application of a developing agent.
Figure 4:
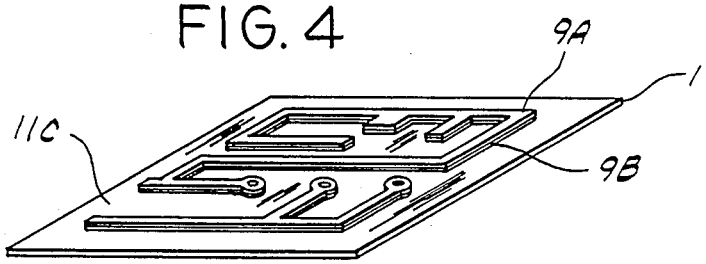
FIG. 4 illustrates the product obtained by use of the etching process of the invention for removal of copper from the sheet in the complementary pattern.
Figure 5:
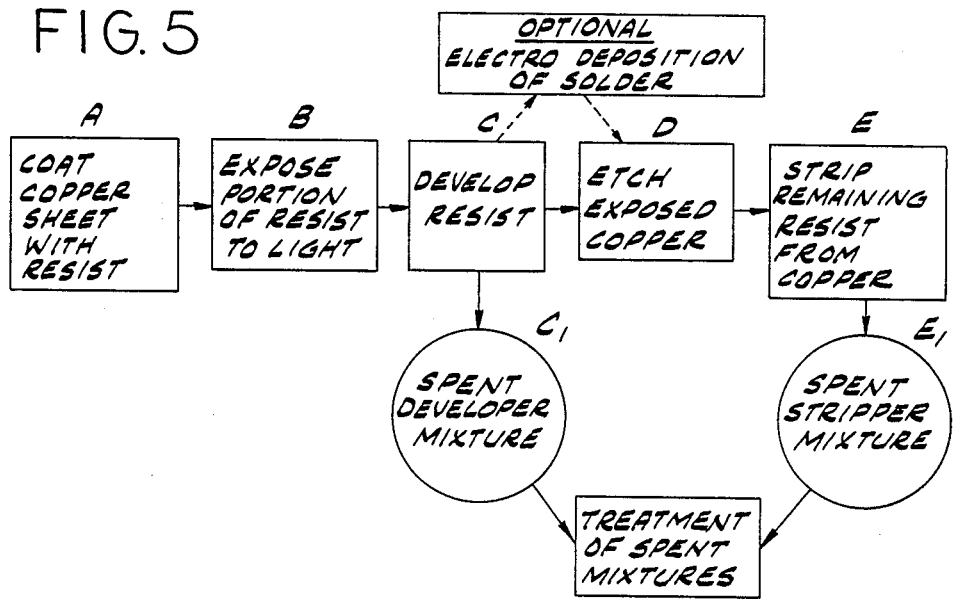
FIG. 5 is a block flow diagram of a typical process for preparation of printed circuit boards.

A typical process for the production of printed circuit boards is illustrated in FIGS. 1-4 and by the block flow diagram of FIG. 5. First the surface of a copper sheet 3, the opposite side of which is supported on a substrate element 1 of high dielectric strength, is coated with a layer 5 of photopolymer called a photoresist (see Step A in FIG. 5). Next, as shown in FIG. 1 and Step B in FIG. 5, a portion of the photoresist is exposed to electromagnetic radiation, typically actinic light, through a photographic film or masking stencil 7 having a transparent pattern 9 therein corresponding to a circuit to be produced on the substrate and a complementary opaque pattern 11 therein. The radiation polymerizes the exposed areas 9A of positive-acting photoresist (see FIG. 2), rendering the exposed areas less soluble. The susceptibility to removal by an alkaline developing agent of the photoresist of the photopolymer layer in the areas of the layer struck by electromagnetic energy, that is, the portion of the photopolymer layer corresponding to the circuit, is thereby altered to produce in the layer a pattern of photoresist material complementary to the circuit which is removable by a developing agent to expose portions of the copper sheet which are not part of the circuit. As indicated by Step C, the photoresist coating of the copper-clad substrate is then processed with a developing agent, conventionally a mild alkaline aqueous developer solution. While the developer solution is aqueous, it may contain a non-aqueous solvent, such as ethylene glycol ether, in addition to water. A developing agent used in circuit board preparation usually comprises a mild aqueous alkaline solution, generally having a pH of between about 9 and about 12. Often, a sodium carbonate solution is used as the developing agent. The solution may also contain a glycol ether. Upon contact of the coating by the developer solution, a reaction as illustrated in the following equation is understood to take place:

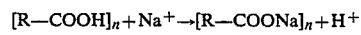

$$[R-COOH]_n + Na^+ \rightarrow [R-COONa]_n + H^+$$

where R is a high molecular weight hydrophobic group.

The developer solution thereby removes the unexposed photoresist from the copper surface. By contrast, in the areas where exposure to light has polymerized the film, changing the film's physical properties and lowering its solubility, the resist adheres to the copper surface and is not removed by the developer, and resist remains intact on the copper surface in a pattern complementary to the circuit (see the developed board shown in FIG. 3). The copper layer is then etched (Step D), ordinarily with peroxide-sulfuric acid etchant or ammonical etchant, to remove the copper 11B in those areas unprotected by the mask of polymerized film remaining on the copper surface. After the etching, a portion 11C of the substrate element 1 complementary to the circuit is essentially free of copper, while a copper circuit pattern 9B remains on the substrate element 1, as shown in FIG.

4. At this point, the circuit is still covered with a corresponding circuit pattern layer 9A.

After the polymerized photopolymer resin, or resist, has served its masking purpose, it is removed, or "stripped" (Step E), by treatment with a stripping agent, normally a hot, alkaline aqueous or partially aqueous solution. Stripping solutions ordinarily employed in circuit board preparation comprise a hot aqueous alkaline solution, generally having a pH of between about 11.5 and about 13. While the stripper solution is aqueous, it may contain a non-aqueous solvent, such as ethylene glycol ether, in addition to water. A solution of sodium hydroxide or an amine solution such as an ethanolamine solution is commonly used as a stripper solution. Typically, the solvent in these solutions is either water or a glycol ether.

Figure 6:
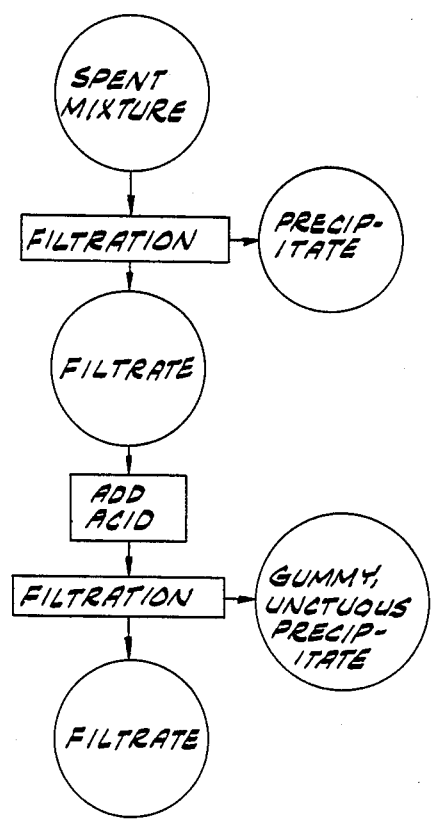
FIG. 6 is a block flow diagram of a conventional method for treating spent mixtures produced during the preparation of printed circuit boards.

In this process, the photopolymer resin removed by the stripper and developer ends up in the spent solutions. As indicated in FIG. 5, the spent developer mixture $C_1$ and the spent stripper mixture $D_1$ are treated for disposal. The ordinary treatment process involves the steps shown in FIG. 6, in which the undissolved photopolymer resins first are separated from the spent mixture by filtration. The filtrate is then acidified to a pH of about 3-4 by addition of a mineral acid. The acidification precipitates formerly dissolved resins in the filtrate. The precipitated resins are then removed from the filtrate by a second filtration and the filtrate is neutralized with alkali to an appropriate pH and treated as waste water. The second filtration in conventional processes yields a tacky, unctuous sludge.

To prepare printed circuit boards by use of "screening ink" or "liquid resist" ink, such as Hysol 3010, manufactured by Dexter Corporation, liquid resist ink is screened onto the surface of a copper sheet, the opposite side of which is supported on a substrate element of high dielectric strength, to form an image of the desired pattern. The pattern is screened onto the substrate by forming the image on a taut screen made of stainless steel or synthetic fabric. The screen is pervious to a liquid resist ink in a pattern corresponding to a desired circuit and impervious to the ink in a pattern complementary to the circuit. The screen is aligned over the substrate and acts as a stencil. Ink is then applied by manually or mechanically pushing the ink across the screen with a squeegee. A thin layer (about 100 to about 300 microinches) of the resist film is spread thereby across the entire pattern. As a result, the resist ink passes through the pervious portion of the screen corresponding to the circuit pattern, and the image of the circuit pattern is thus transformed onto the copper sheet. The screened image on the copper coating on the substrate is then cured by ultraviolet radiation or by baking. The curing process typically includes air-drying, pre-baking and post-baking in addition to the ultraviolet radiation of baking step. The pre-baking steps drive off some solvents, thereby avoiding run off of ink. The post-baking steps drive off residual solvents from the resist. The cured ink resists the chemical attack during the subsequent cleaning, plating and etching steps. The copper sheet is then etched to remove the copper in those areas unprotected by the ink pattern on the copper surface. After etching, a stripping agent is applied to remove the ink from the copper. The spent stripping mixture resulting from such processes is similar to that produced in the process described above and thus receives the same type of treatment.

The present invention concerns the treatment of spent mixtures produced as waste during the production of printed circuit boards. As is clear from FIG. 5, the spent mixtures may comprise either spent developer mixture or spent stripper mixture, or both. Since, in the photopolymer resin process, the spent developer mixture contains unexposed photopolymer resin, while the spent stripper mixture contains photopolymer resin which has been exposed to light, the resin in the spent developer mixture has been polymerized to a lesser degree than the resin in the spent stripper mixture. However, the degree of polymerization of the resin in the spent mixture does not substantially affect the treatment process of this invention.

Figure 7:
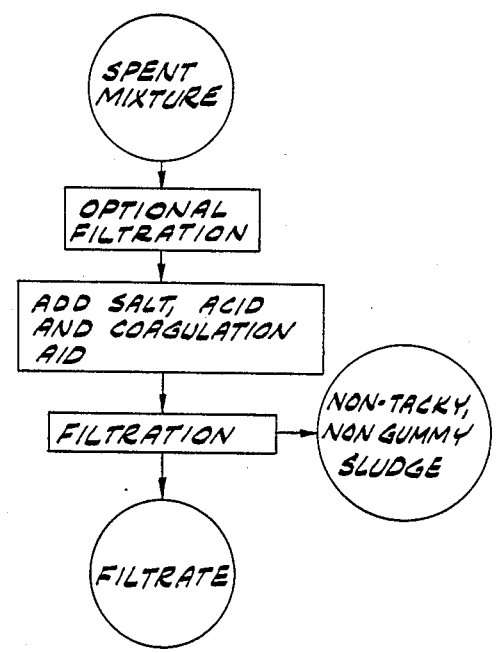
FIG. 7 is a block flow diagram of a process of this invention for treating spent mixtures produced during the preparation of printed circuit boards Corresponding reference characters indicate corresponding parts in the several views of the drawings.

Generally, as shown in FIG. 7, according to this invention a polyvalent cation, an acid and a coagulation aid are added to either the spent developing or spent stripping mixtures resulting from the preparation of printed circuit boards. The treated spent mixture can then be separated into an essentially resin-free filtrate and a non-tacky, non-gumlike sludge for any necessary environtmental treatment and disposal.

The spent treatment process of this invention is illustrated generally in FIG. 7. The polyvalent cation, acid and coagulation aid may be introduced to the spent mixture, and the subsequent separation accomplished, by any of several procedures. Thus, for example, the spent mixture, containing dissolved as well as undissolved resins present as precipitate or colloids, may be treated by first adding a polyvalent cation, then adding an acid to lower the pH of the mixture to induce precipitation of the dissolved resins, and finally adding a coagulation aid to enhance precipitation. Preferably, however, the polyvalent cation and acid are combined in an additive solution which is introduced into the spent mixture. In either case, substantially all of the resins, whether formerly in colloidal, dissolved or precipitated form, should be precipitated. The precipitated resins, may then be separated from substantially resin-free solution by filtration. The resins treated and filtered in this manner are neither tacky nor gumlike. Since the resins that are undissolved in the spent mixture even before treatment of the mixture with a polyvalent cation and acid are not tacky or gumlike resins, they may be separated out of the mixture by a preliminary filtration step that may take place prior to the addition of a polyvalent cation and acid, if so desired. Preferably, however, the spent mixture is treated with acid, polyvalent cation and coagulation aid before any filtration is carried out.

As noted, a spent mixture comprising either a spent developer mixture or a spent stripper mixture may also be treated by the method of this invention. The spent developer mixture usually contains dissolved resins and ordinarily results from processing a circuit board coated by a partially light exposed photopolymer with an aqueous alkaline solution such as a sodium carbonate solution having a temperature of about 80°-85° F. (about 26.6°-29.4° C.) and a pH of about 9-12. Temperatures substantially above 85° F. (29.4° C.) risk reaction with, and therefore removal of, the photopolymer that has been polymerized by exposure to light. A wide variety of photopolymers, such as acrylics, are employed in the preparation of circuit boards and are well known in the art by their trade names. However, the photopolymers generally have the formula $[R-COOH]_n$, where R is a high molecular weight hydrophobic group. Typical commercial photopolymers include aqueous processable photopolymers, such as Riston 3600 series photopolymers, Laminar HG photopolymers and Laminar TA photopolymers, and semiaqueous processable photopolymers, such as Riston 200 series photopolymers and Laminar AX photopolymers. While the precise compositions of these photopolymers are retained as trade secrets by their respective manufacturers, it is believed that the photopolymers are acrylics. The Riston photopolymers are sold by Du Pont, Riston Division, while the Laminar photopolymers are sold by Dynachem, a subsidiary of Morton-Thiokol.

The spent stripper mixture results from a dip or spray application of a hot aqueous alkaline stripper solution to a circuit board having selective portions coated with liquid resist ink or with polymerized photopolymer. The stripper solution may contain sodium hydroxide or an amine such as ethanolamine, and has a pH of about 11.5-13 and a temperature of about 125°-140° F. (about 51.6°-60° C). This hot alkaline solution removes the ink or polymerized photopolymer by the same reaction scheme described in equation A. While the photopolymers in the spent stripper mixture are polymerized to a greater degree than those in the spent developer mixture, the degree of polymerization of the photopolymers therein does not substantially affect the subsequent treatment of the spent mixtures. In other words, the treatment process of spent stripper mixture is the same as the treatment process of spent developer mixture. Thus, where spent mixture is discussed below, the spent mixture may be either of, or some mixture of, the two types of spent mixture.

Polyvalent cations useful in the process of this invention are supplied by addition of salts comprising a polyvalent cation. Preferably, the salt comprises a divalent or trivalent cation, more preferably a Group IIA, Group IIB or Group IIIA metal ion or an iron ion. Most preferably, such salts comprise the chlorides and sulfates of aluminum and zinc, such as $AlCl_3.6H_2O$, $ZnCl_2$ and $ZnSO_4.7H_2O$. While not wishing to be bound to any particular theory, it is believed that the process of this invention acts by causing the resin to cross-link by attachment of the polyvalent cation of these salts to the carboxyl groups of the resins.

Preferably, the concentration of polyvalent cation in the polyvalent cation and acid mixture solution ranges from about 1% to about 5% by weight, while the concentration of the acid ranges from about 25% to about 35%. The polyvalent cation and acid solution may then be added to spent developer or spent stripper such that the polyvalent cation and acid solution comprises about 2% to about 15% of total volume of the resulting solution. Since different resists precipitate at different pH's, the relative amount of polyvalent cation and acid solution added to spent solution depends on the particular resist resin in the spent solution. It has been found that whereas Laminar AX will precipitate at a pH of about 10, the Riston 200 series photopolymers will precipitate at a pH of about 7. This compares with the prior art processes which teach acidification to a pH of 4.

Since the purpose of the acid in the treatment of spent solutions is merely to lower the pH of the spent mixture, a wide range of acids, whether organic, mineral or other acid, can be employed. However, sulfuric acid typically is used for this purpose.

Coagulation aids of this invention include commercially available polyelectrolytes. Preferably, the polyelectrolytes are anionic or nonionic. A typical anionic polyelectrolyte is Separan AP-273, sold by Dow Chemical.

Commercial coagulation aids are available in powder form. In preparation for application to spent solution treated with a polyvalent cation and acid, the powder coagulation aid is added to water to form a highly viscous slurry concentrate containing between about 1% and about 10% coagulation aid, depending on the viscosity resulting from the particular coagulation aid. Agitation is required to maintain the colloidal coagulation aid suspended. This concentrate is then diluted ten-fold. The resulting solution is also highly viscous, and to ensure adequate dipersal of the colloidal coagulation aid, should be formulated not long before it is to be added to treated spent solution. An amount of this dilute, but viscous, solution is added to treated spent solution so that the resulting mixture contains between about 10 and about 50 ppm coagulation aid.

Since, in sharp contrast to the unctuous, gumlike precipitate produced in the prior art, the resulting precipitated resins are non-tacky and non-gumlike, the problems of disposal of and of cleaning the equipment and surfaces contacted by the resins are greatly reduced. In addition, it has been discovered that the pH of the mixture required to induce precipitation of the dissolved resins in the process of the subject invention need not be as low as the pH required by the prior art process to induce precipitation. Therefore, less acid is necessary for the pH adjustment in the new process and the present invention allows a reduction in acid consumption.

The following examples illustrate the invention.

EXAMPLE 1

A typical stripper solution was prepared by mixing ethanolamine (60 gm.) with butyl Cellosolve (ethylene glycol monobutyl ether) (90 gm.) and deionized water (final volume 1000 ml.). A portion of the solution (150 ml.) was heated to 130° F. (54.4° C.) and maintained at that temperature in a water bath.

EXAMPLE 2

A waste treatment solution was prepared by mixing sulfuric acid (300 gm.) with deionized water (final volume 1000 ml.). The solution was cooled to room temperature.

EXAMPLE 3

A second waste treatment solution was prepared by dissolving hydrated aluminum chloride (2 to 10 gm. $AlCl_3.6H_2O$) in waste treatment solution of Example 2 (200 ml.).

EXAMPLE 4

A third waste treatment solution was prepared by dissolving hydrated zinc sulfate (2 to 10 gm. $ZnSO_4.7H_2O$) in waste treatment solution of Example 2 (200 ml.).

EXAMPLE 5

A fourth waste treatment solution was prepared by dissolving zinc chloride (2 to 10 gm. $ZnCl_2$) in waste treatment solution of Example 2 (200 ml.).

EXAMPLE 6

Laminar AX, a semi-aqueous processable photopolymer dryfilm, was prepared according to the manufacturer's instructions. To simulate the process of stripping photopolymer from circuit boards, the film was immersed in stripper solution prepared as in Example 1, thereby producing a spent mixture. This procedure was repeated with various films for several runs. In order to simulate various actual working conditions, the amount of photopolymer immersed was varied from run to run between the equivalent of 25 mil square feet per gallon (MSF/GL) to 60 MSF/GL. MSF is the volume of one mil thick film.

The strip characteristics ranged from total dissolution to skin-peel during the film's immersion in the stripper solution, depending on the degree of polymerization, thickness of the film, and chemical composition of the stripper solution. While the thickness in the film varied in the tests, the industry practice is to attempt to obtain small skin sizes or particles so that the detached polymer film could be rinsed away or filtered out.

Waste treatment solutions from Examples 2-5 were added individually with mixing to the above spent mixtures after filtration. Due precaution was exercised adjusting the pH during the additions, so that the particular level of pH at which the sludge formed could be observed and at such time the additions could be stopped. At this point, polyelectrolyte was added to coagulate the sludge. The results are as follows:

| Treatment Solutions | pH at Which Sludge Formed | Texture of sludge |
|---|---|---|
| Sulfuric acid alone | 4.0 | Unctuous, gumlike mass |
| Sulfuric acid + $AlCl_3.6H_2O$ | 4.0 | Non-tacky gumlike mass |
| Sulfuric acid + $ZnSO_4.7H_2O$ | 10.0 | Non-tacky sludge and precipitate |

To check the completeness of removal, acid was added to the treated mixtures. The treated mixtures were filtered using Whatman No. 4 filter paper and concentrated sulfuric acid was added slowly to the filtrate. More resin did not precipitate out of the solution, indicating that the solutions were essentially completely removed of resin.

EXAMPLE 7

Riston 200 series photopolymers, also semiaqueous processable photopolymer films, were treated as in Example 6 and the results so obtained are as follows:

| Treatment Solutions | pH at Which Sludge Formed | Texture of sludge |
|---|---|---|
| Sulfuric acid alone | 3.5 | Unctuous, gumlike mass |
| Sulfuric acid + $AlCl_3.6H_2O$ | 6.5 | Non-tacky sludge and precipitate |
| Sulfuric acid + $ZnSO_4.7H_2O$ | 6.5 | Non-tacky sludge and precipitate |
| Sulfuric acid + $ZnCl_2$ | 6.5 | Non-tacky sludge and precipitate |

EXAMPLE 8

Various aqueous processable photopolymer films were treated as in Example 6 and the results follow:

| Photopolymer Film | Treatment Sol'n | pH | Texture of Sludge |
|---|---|---|---|
| Laminar HG | Sulfuric acid | 3.5 | Unctuous, gumlike mass |
| Laminar TA | Sulfuric acid | 3.5 | Unctuous, gumlike mass |
| Riston 3600 Series | Sulfuric acid | 3.5 | Unctuous, gumlike mass |
| Laminar HG | Sulfuric acid + $AlCl_3.6H_2O$ | 4.0 | Non-tacky sludge and precipitate |
| Laminar TA | Sulfuric acid + $AlCl_3.6H_2O$ | 4.0 | Non-tacky sludge and precipitate |
| Riston 3600 Series | Sulfuric acid + $AlCl_3.6H_2O$ | 4.0 | Non-tacky sludge and precipitate |

EXAMPLE 9

A spent Cellosolve (see Example 1) developer solution saturated with Riston 200 series photopolymer dryfilm was treated as in Example 6. The spent developer solution was from an actual working bath. The results are listed as follows:

| Treatment Solutions | pH at Which Sludge Formed | Texture of sludge |
|---|---|---|
| Sulfuric acid alone | 3.0 | Unctuous, gumlike mass |
| Sulfuric acid + $AlCl_3.6H_2O$ | 6.5 | Non-tacky sludge and precipitate |
| Sulfuric acid + $ZnSO_4.7H_2O$ | 7.0 | Non-tacky sludge and precipitate |
| Sulfuric acid + $ZnCl_2$ | 6.5 | Non-tacky sludge and precipitate |

EXAMPLE 10

Samples of the sludges from Examples 6-9 were washed and dried and the filtrates from which the sludge samples were separated were prepared for metal analysis as follows. From each sample, sludge (0.2 gm) was dissolved in methanol (20 ml). The sludge/methanol solution was analyzed for aluminum and zinc. Also, the corresponding filtrates were analyzed for the same metals before and after treatment involving neutralization with alkali metal hydroxide and filtration. The results were as follows:

| METALS IN SLUDGE | | | |
|---|---|---|---|
| Combinations | Metal | Amount of Sludge | Amount of Metal in Sludge |
| Riston 200/ Developer | Zn | 6.7 gm/L | 5.39 ppm |
| Riston 3600/ Stripper | Zn | 8.6 gm/L | 2.77 ppm |

| METALS IN FILTRATE | | | |
|---|---|---|---|
| Combinations | Metal | Amount of Metal [before treatment] | Amount of Metal [after treatment] |
| Riston 200/ Developer | Al | 4.56 ppm | 0.452 ppm |
| Riston 200/ Developer | Zn | 56.3 ppm | 7.68 ppm |
| Riston 3600/ Stripper | Al | 138.0 ppm | 0.822 ppm |
| Riston 3600/ Stripper | Zn | 131.0 ppm | 135.0 ppm |

EXAMPLE 11

A stripper solution comprising Cellosolve was saturated with Hysol 3010 (manufactured by Dexter Corporation) screening ink and treated as was the saturated stripping solution in Example 6 above. The following results were obtained.

| Treatment Solutions | pH at which Sludge Formed | Texture of sludge |
|---|---|---|
| Sulfuric acid alone | 3.0 | Unctuous, gumlike mass |
| Sulfuric acid + AlCl$_3$.6H$_2$O | 4.0 | Non-tacky sludge and precipitate |
| Sulfuric acid + ZnSO$_4$.7H$_2$O | 4.0 | Non-tacky sludge and precipitate |

In view of the above, it will be seen that the several objects of the invention are achieved and other advantageous results attained.

As various changes could be made in the above constructions without departing from the scope of the invention, it is intended that all matter contained in the above description shall be interpreted as illustrative and not in a limiting sense.

What is claimed is:

1. A method for treating an aqueous, alkaline spent mixture comprising photopolymerizable material resist photopolymerized resist, or combination of photopolymerizable and photopolymerized resists, said spent mixture having been produced during preparation of circuit boards, the method comprising:

mixing an acid, a polyvalent cation and a coagulation aid with the spent mixture to produce a heterogeneous treated mixture comprising coagulated, precipitated photopolymer resin and an aqueous phase; and separating the coagulated, precipitated photopolymer resin from the aqueous phase to produce a non-tacky, non-gumlike photopolymer resin sludge.

2. A method as set forth in claim 1 wherein the coagulation aid comprises a polyelectrolyte.

3. A method as set forth in claim 1 wherein the polyvalent cation is a divalent or trivalent cation.

4. A method as set forth in claim 1 wherein the polyvalent cation is selected from the group consisting of Group IIA metals, Group IIB metals, Group IIIA metals and iron.

5. A method as set forth in claim 1 wherein the polyvalent cation is provided in the form of a metal salt selected from the group consisting of aluminum chloride, aluminum sulfate, zinc chloride and zinc sulfate.

6. A method as set forth in claim 1 wherein the acid and polyvalent cation are mixed with the spent mixture to produce a heterogeneous intermediate composition comprising a precipitated photopolymer resin and an aqueous phase, and the coagulation aid is then mixed with the intermediate composition to coagulate the precipitated photopolymer resin therein and produce a heterogeneous treated mixture comprising coagulated, precipitated photopolymer resin and an aqueous phase.

7. A method for preparation of a printed circuit board comprising the steps of:

applying a layer comprising a photopolymerizable resist material over the surface of a copper sheet, the opposite surface of said copper sheet being adhered to a substrate element constituted of a material having a high dielectric strength;

exposing said layer of photopolymerizable resist material to electromagnetic energy through a photographic transparency or stencil having a pattern therein corresponding to the desired configuration of a circuit to be produced on said substrate element, thereby altering the susceptibility to removal by an alkaline developing agent of the photopolymerizable material of said layer in the areas thereof struck by photomagnetic energy and producing in said layer a pattern of photoresist material which is complementary to said circuit pattern and which may be removed by said developing agent to expose portions of said copper sheet which are not part of said circuit;

applying said developing agent to said layer of photopolymerizable resist material to remove said photoresist material from said sheet in said complementary pattern, thereby producing a spent developer mixture comprising photoresist material;

mixing an acid, a polyvalent cation and a coagulation aid with the spent mixture to produce a heterogeneous treated mixture comprising coagulated, precipitated photopolymer resin and an aqueous phase; and separating the coagulated, precipitated photopolymer resin from the aqueous phase to produce a non-tacky, non-gumlike photoresist sludge.

8. A process for preparation of a printed circuit board comprising the steps of:

applying a layer comprising a photopolymerizable resist material over the surface of a copper sheet, the opposite surface of said copper sheet being adhered to a substrate element constituted of a material having a high dielectric strength;

exposing said layer of photopolymerizable resist material to electromagnetic energy through a photographic transparency or stencil having a pattern therein corresponding to the desired configuration of a circuit to be produced on said substrate element, thereby altering the susceptibility to removal by an alkaline developing agent of the photopolymerizable resist material of said layer in the areas thereof struck by electromagnetic energy and producing in said layer a pattern of photoresist material which is complementary to said circuit pattern and which may be removed by said developing agent to expose portions of said copper sheet which are not part of said circuit;

applying said developing agent to said layer of photopolymerizable resist material to remove said photoresist material from said sheet in said complementary pattern, thereby producing a spent developer mixture comprising photoresist material;

contacting with a stripping agent the photopolymerized resist material remaining on the copper of said circuit, thereby removing the remaining photopolymerized resist material from the copper and producing a spent stripper mixture comprising photopolymerized resist material.

mixing an acid, a polyvalent cation and a coagulation aid with the spent stripper mixture to produce a heterogeneous treated mixture comprising coagulated, precipitated photopolymer resin and an aqueous phase; and separating the coagulated, precipitated photopolymer resin from the aqueous phase to produce a non-tacky, non-gumlike photopolymer resin sludge.

9. A process for preparation of a printed circuit board comprising the steps of:

applying a layer comprising a photopolymerizable resist material over the surface of a copper sheet, the opposite surface of said copper sheet being adhered to a substrate element constituted of a material having a high dielectric strength;

exposing said layer of photopolymerizable resist material to electromagnetic energy through a photographic transparency or stencil having a pattern therein corresponding to the desired configuration of a circuit to be produced on said substrate element, thereby altering the susceptibility to removal by an alkaline developing agent of the photopolymerizable resist material of said layer in the areas thereof struck by electromagnetic energy and producing in said layer a pattern of photoresist material which is complementary to said circuit pattern and which may be removed by said developing agent to expose portions of said copper sheet which are not part of said circuit;

applying said developing agent to said layer to remove said photoresist material from said sheet in said complementary pattern, thereby producing a first spent mixture comprising photoresist material;

contacting with a stripping agent the remaining photoresist on the copper of said circuit, thereby removing the remaining photopolymerized resist material from the copper, thereby producing a second spent mixture comprising photopolymerized resist material;

mixing an acid, a polyvalent cation and a coagulation aid with at least one of the spent mixtures to produce a heterogeneous treated mixture comprising coagulated, precipitated photopolymer resin and an aqueous phase; and separating the coagulated, precipitated photopolymer resin from the aqueous phase to produce a non-tacky, non-gumlike photopolymer resin sludge.

* * * * *